United States Patent
Shimomura

(10) Patent No.: US 6,677,801 B2
(45) Date of Patent: Jan. 13, 2004

(54) INTERNAL POWER VOLTAGE GENERATING CIRCUIT OF SEMICONDUCTOR DEVICE

(75) Inventor: Narakazu Shimomura, Gojo (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/118,426

(22) Filed: Apr. 9, 2002

(65) Prior Publication Data

US 2002/0145466 A1 Oct. 10, 2002

(30) Foreign Application Priority Data

Apr. 10, 2001 (JP) .................................... 2001-111818

(51) Int. Cl.[7] ................................................ G05F 3/02
(52) U.S. Cl. ...................... 327/530; 327/541; 327/334; 327/538
(58) Field of Search ................... 327/334, 530, 327/538, 543, 540, 541, 545, 546; 361/103, 513, 538, 543

(56) References Cited

U.S. PATENT DOCUMENTS

| | | | | |
|---|---|---|---|---|
| 4,857,769 A | * | 8/1989 | Kotera et al. | 327/541 |
| 4,924,212 A | * | 5/1990 | Fruhauf et al. | 340/598 |
| 5,335,203 A | * | 8/1994 | Ishii et al. | 365/226 |
| 5,467,052 A | * | 11/1995 | Tsukada | 327/543 |
| 5,798,637 A | * | 8/1998 | Kim et al. | 323/313 |
| 5,841,270 A | * | 11/1998 | Do et al. | 323/314 |
| 5,856,756 A | * | 1/1999 | Sasahara et al. | 327/540 |
| 5,892,409 A | * | 4/1999 | Boerstler | 331/57 |
| 6,034,519 A | * | 3/2000 | Yang | 323/314 |
| 6,140,864 A | * | 10/2000 | Hirata et al. | 327/544 |
| 6,157,246 A | * | 12/2000 | Saitou et al. | 327/540 |
| 6,229,384 B1 | * | 5/2001 | Ohsawa | 327/541 |
| 6,320,809 B1 | * | 11/2001 | Raad | 365/226 |
| 6,342,997 B1 | * | 1/2002 | Khadkikar et al. | 361/103 |
| 6,492,864 B2 | * | 12/2002 | Mahrla | 327/540 |

FOREIGN PATENT DOCUMENTS

JP 6-326588 11/1994

* cited by examiner

*Primary Examiner*—Terry D. Cunningham
(74) *Attorney, Agent, or Firm*—Nixon & Vanderhye P.C.

(57) ABSTRACT

An internal power voltage generating circuit of a semiconductor device includes a voltage dividing circuit composed of a single field effect transistor and a plurality of resistances incorporated into a semiconductor chip. The voltage dividing circuit divides an externally supplied power voltage into two types of voltage by conducting or non-conducting the single field effect transistor. The divided voltages are supplied as an internal power voltage to a plurality of field effect transistors incorporated into the semiconductor chip.

3 Claims, 3 Drawing Sheets

INTERNAL POWER VOLTAGE GENERATING CIRCUIT OF SEMICONDUCTOR DEVICE

CROSS-REFERENCE TO RELATED APPLICATION

This application is related to Japanese application No. 2001-111818 filed on Apr. 10, 2001, whose priority is claimed under 35 USC § 119, the disclosure of which is incorporated by reference in its entirety.

BACKGROUND OF THE INVENTION

1. Field of the Invention

The present invention relates to an internal power voltage generating circuit of a semiconductor device.

2. Description of the Related Art

FIG. 4 is a functional block diagram showing a function of a conventional general semiconductor device.

Provided at the semiconductor device are a protection circuit 12 and an input-output circuit 13 in addition to a functional circuit 11 (such as a logic circuit, memory circuit, control circuit or the like) that takes charge of the original function. A signal S such as data or address is inputted to or outputted from the functional circuit 11 via the protection circuit 12 and the input-output circuit 13.

A power P is supplied from an external power supply to these protection circuit 12, input-output circuit 13 and functional circuit 11. Generally, a voltage set in advance is supplied to the functional circuit 11.

A semiconductor device is generally designed for allowing a margin so as to satisfy its specification with respect to a process variation upon manufacturing the device. However, it is difficult to design the device with the margin allowed, as the miniaturization has been advanced. Further, the more the miniaturization has been advanced, the greater the degree of the characteristic variation of each element becomes with respect to the process variation. Therefore, the design allowing this great characteristic variation becomes difficult. Consequently, a semiconductor chip or wafer that does not satisfy the specification has been manufactured, to thereby increase a possibility of reducing a yield.

A semiconductor device disclosed in Japanese Unexamined Patent Application No. Hei 6(1994)-326588 has been known as the one that prevents the reduction in the yield with respect to the process variation. This semiconductor device supplies, every semiconductor chip, an optimum operation voltage corresponding to the process variation, so that each semiconductor chip can be used under a nearly optimum condition. By this structure, the device aims to draw out the maximum performance of each semiconductor chip.

FIG. 5 is a view showing a circuit that generates internal power voltage of this semiconductor device. The circuit for generating the internal power voltage is consisted of a reference potential generating circuit 14 and a constant voltage circuit 15.

The reference potential generating circuit 14 includes a resistance R, a plurality of diodes D and a plurality of fuses F connected respectively in parallel to a portion of the diodes D. The reference potential generating circuit 14 divides the external power supply voltage Vcc via the resistance R and the diode D to thereby generate a reference voltage Vref.

The constant voltage circuit 15 is consisted of a current mirror circuit and a source follower circuit. The constant voltage circuit 15 outputs the internal power voltage Vint having the same potential as the reference potential Vref.

Disconnecting a portion of the fuses F generates a desired internal power voltage Vint in the circuit for generating the internal power voltage. When a silicon diode is used for the diode D, for example, electric current begins to flow at a forward bias of approximately 0.6 V per one diode, so that the reference potential Vref becomes a value obtained by multiplying approximately 0.6 V by a number of the diodes. By utilizing this, the fuse F is disconnected so as to change the number of the diodes D, to thereby change the value of the reference potential Vref.

However, the reference potential Vref is determined only by the values of the diode D and the resistance R in the above-mentioned voltage generating circuit, whereby it only takes a discrete number determined by the forward bias (voltage value of approximately 0.6 V) of the diode D. When a silicon diode is used as described above, for example, it only takes a value integral times as great as 0.6 V.

Further, a process for disconnecting the fuse F is required for selecting the optimum internal power voltage Vint, resulting in entailing a problem of increasing a manufacturing cost as well as lengthening a turnaround time (TAT) due to the increase in the number of a manufacturing process.

SUMMARY OF THE INVENTION

The present invention is accomplished in view of the above-mentioned circumstances, and aims to provide an internal power voltage generating circuit of a semiconductor device capable of supplying a suitable internal power voltage for drawing out a maximum performance of the semiconductor device without adding a process of disconnecting a fuse, even when a process variation occurs.

The present invention provides an internal power voltage generating circuit of a semiconductor device comprising a voltage dividing circuit composed of a single field effect transistor and a plurality of resistances incorporated into a semiconductor chip, wherein the voltage dividing circuit divides an externally supplied power voltage into two types of voltage by conducting or non-conducting the single field effect transistor, the divided voltages being supplied as an internal power voltage to a plurality of field effect transistors incorporated into the semiconductor chip.

According to the present invention, an externally supplied voltage is divided at a voltage dividing circuit into two types of voltage by conducting or non-conducting a single field effect transistor included in the voltage dividing circuit. The divided voltages are supplied as an internal power voltage to a plurality of field effect transistors incorporated into the semiconductor chip. This structure results in changing a value of the internal power voltage in accordance with a value of threshold voltage of the single field effect transistor, the value of threshold voltage having been varied due to a process variation during manufacture of the semiconductor chip.

DESCRIPTION OF THE PREFERRED EMBODIMENT

Figure 1:
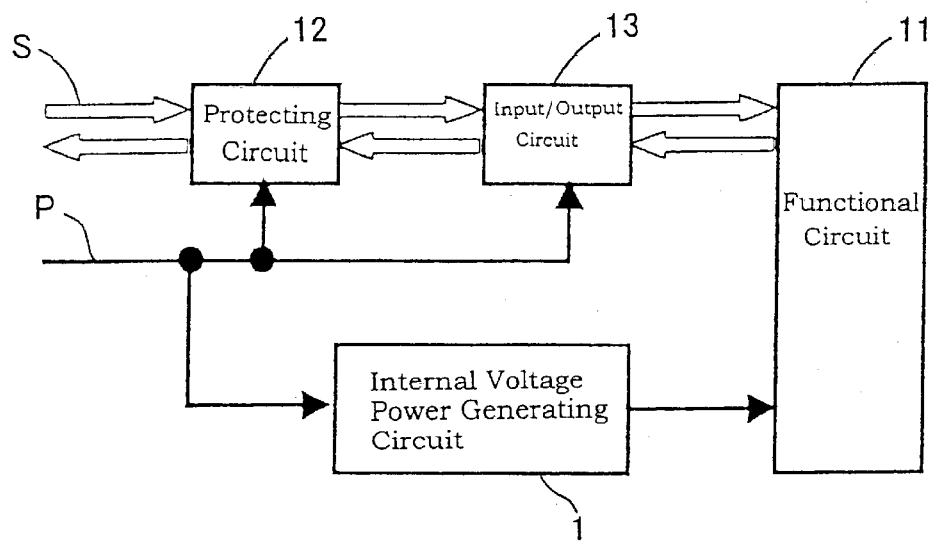
FIG. 1 is a functional block diagram of a semiconductor device to which an internal power voltage generating circuit of the present invention is applied.

An internal power voltage generating circuit of a semiconductor device according to the present invention includes a voltage dividing circuit. A value of the voltage divided at the voltage dividing circuit is changed depending upon a conducting state (i.e., conducting or non-conducting) of a single field effect transistor since the voltage dividing circuit is composed of the single field effect transistor and resistances. The change in the divided voltage is attained by utilizing the change-over of the conducting state of the single field effect transistor depending upon whether a threshold voltage value of the single field effect transistor is greater or smaller than a constant voltage applied to a gate electrode of the single field effect transistor.

In case where the threshold voltage value of the field effect transistors incorporated into the semiconductor chip falls low due to the process variation upon manufacturing the semiconductor chip, a power consumption at a stand-by state generally increases, so that a desired specification is not satisfied. In order to prevent this, it is effective to decrease a little the internal power voltage supplied to the field effect transistors incorporated into the semiconductor chip.

In the present invention, when the threshold voltage of the field effect transistors incorporated into the semiconductor chip, i.e., the threshold voltage of the field effect transistor in the voltage dividing circuit, is higher than the constant voltage applied to the gate electrode of the field effect transistor, the field effect transistor is in the non-conducting state, whereby a voltage corresponding to a circuit constant of this non-conducting state is outputted from the voltage dividing circuit.

On the other hand, when the threshold voltage of the field effect transistor in the voltage dividing circuit becomes lower than the constant voltage applied to the gate electrode of the field effect transistor, the field effect transistor is in the conducting state to thereby switch the constant circuit of the voltage dividing circuit, whereby a voltage corresponding to the circuit constant of this conducting state is outputted from the voltage dividing circuit.

As described above, the circuit constant of the voltage dividing circuit is changed to thereby reduce the internal power voltage supplied to the field effect transistors incorporated into the semiconductor chip, when the threshold voltage of the field effect transistors falls low.

Accordingly, the present invention can supply an optimum internal operating voltage in accordance with a process variation every semiconductor chip without adding a process of disconnecting a fuse in an internal power voltage generating circuit provided in the semiconductor device, whereby each semiconductor chip can be used under a nearly optimum condition.

Preferred embodiments of the present invention will be explained hereinbelow with reference to FIGS. 1 to 3, by which the present invention is not limited and various modifications can be applied thereto.

FIG. 1 is a functional block diagram of a semiconductor device to which an internal power voltage generating circuit of the present invention is applied.

Provided at the semiconductor device are a functional circuit 11 (such as a logic circuit, memory circuit, control circuit or the like) that takes charge of the original function, a protection circuit 12, an input-output circuit 13 and an internal power voltage generating circuit 1. A signal S such as data or address is inputted to or outputted from the functional circuit 11 via the protection circuit 12 and the input-output circuit 13.

A power P is supplied from an external power supply to the protection circuit 12, input-output circuit 13 and internal power voltage generating circuit. A power source of the functional circuit 11 is supplied from the internal power voltage generating circuit 1. The internal power voltage produced from the internal power voltage generating circuit 1 is automatically set to an optimum voltage in accordance with a process variation upon manufacturing the semiconductor device.

Specifically, the on-off characteristic of an FET (field effect transistor) described later is utilized so as to select a desired internal power voltage among a plurality of internal power voltages that have been set in advance and to generate the selected one that is supplied to the functional circuit 11.

Explained hereinbelow are two embodiments of the internal power voltage generating circuit 1.

Embodiment 1

Figure 2:
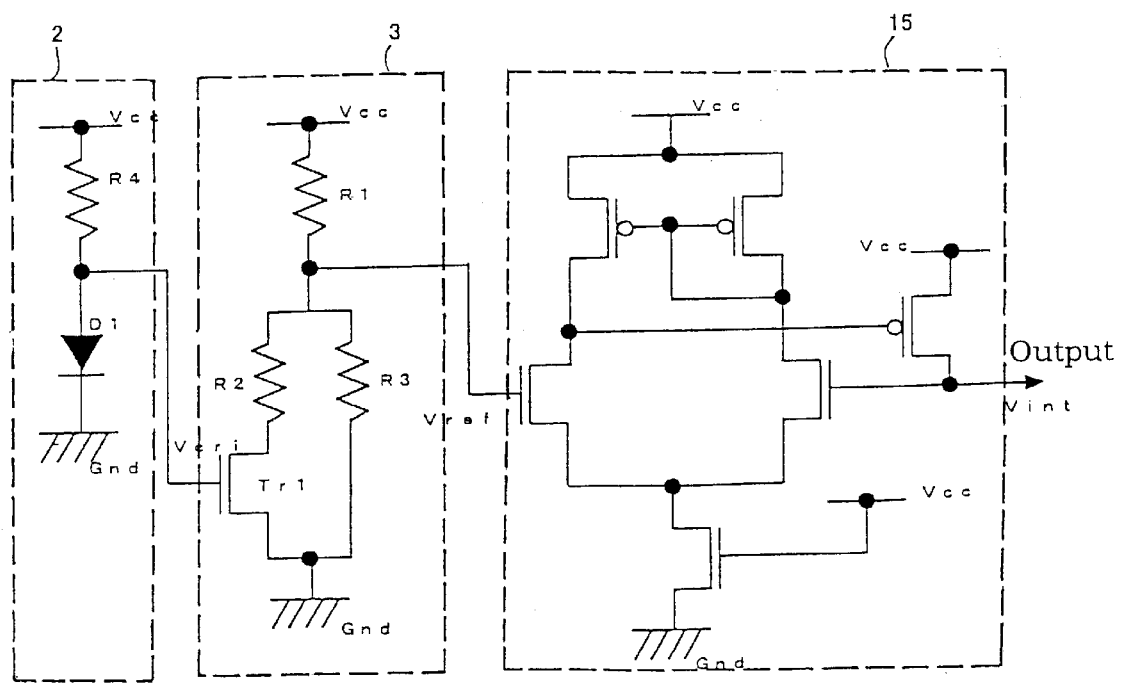
FIG. 2 is a circuit diagram showing a construction of an internal power voltage generating circuit according to an embodiment 1 of the present invention.

FIG. 2 is a circuit diagram showing a construction of an internal power voltage generating circuit of the embodiment 1 according to the present invention.

The internal power voltage generating circuit of this embodiment is consisted of a reference potential generating circuit 2, automatic voltage adjusting circuit 3 and the constant voltage circuit 15. The constant voltage circuit 15, that is consisted of the current mirror circuit and the source follower circuit like the constant voltage circuit shown in FIG. 15, outputs an internal power voltage Vint having the potential same as the reference potential Vref.

The reference potential generating circuit 2 has a resistance R4 and a diode D1. The reference potential generating circuit 2 divides an external power voltage Vcc via the resistance R4 and the diode D1 to generate a decision potential Vcri. Used for the diode D1 is the one for causing forward current to start to flow at a bias of approximately 0.6 V, for which the decision potential Vcri is approximately 0.6 V.

The automatic voltage adjusting circuit 3 has resistances R1, R2 and R3 as well as a transistor Tr1. It has a circuit structure such that a first circuit comprising the resistance R1 is connected in series to a second circuit comprising a series circuit having the resistance R2 and the transistor Tr1 as well as the resistance R3, this series circuit being connected in parallel to the resistance R3.

N-MOS FET is used as the transistor Tr1. This N-MOS FET is incorporated into a semiconductor chip of this semiconductor device and has a characteristic same as the N-MOS FET in the functional circuit 11 since the substrate, drain, source, gate or the like utilizes the same devices as those in the N-MOS FET in the functional circuit 11.

The automatic voltage adjusting circuit 3 divides the external voltage power Vcc via the resistances R1, R2 and R3 as well as the transistor Tr1 to thereby generate the reference potential Vref. In this automatic voltage adjusting circuit 3, the transistor Tr1 is connected in series to the resistance R2. The decision potential Vcri for controlling the conducting state of the transistor Tr1 is applied to the gate electrode of the transistor Tr1. Depending upon whether the transistor Tr1 is conducted or not, a desired one type of reference potential Vref is selected among two types of reference voltage Vref that have been set in advance, and then, the selected one is generated.

The following problems occur when the threshold voltage of the transistor in the functional circuit 11 falls low due to the process variation upon manufacturing. Specifically, assuming the threshold voltage that has been set to 0.6 V at a designing stage becomes lower than 0.6 V due to the process variation, for example. When the device is normally used without decreasing the internal power voltage supplied to the functional circuit 11 in this case, the power consumption at the stand-by state increases, thereby not satisfying the specification of the semiconductor chip. On the other hand, it has been found that decreasing the internal power voltage supplied to the functional circuit 11 can decrease the power consumption at the stand-by state, to thereby get the maximum performance and specification of the semiconductor chip.

Accordingly, in case where the threshold voltage of the transistor in the functional circuit 11 falls low, the internal power voltage is controlled to be decreased. As a result, the transistor in the functional circuit 11 can be used under a nearly optimum condition with the current flowing at the stand-by state controlled to be reduced.

A specific example will be shown. Voltage of 0.6 V, for example, is applied as the decision potential Vcri to the gate electrode of the transistor Tr1 in the automatic voltage adjusting circuit 3.

At this time, the threshold voltage of the transistor Tr1 (the threshold voltage of the transistor in the functional circuit 11, too) is supposed to be changed from 0.6 V at the designing stage due to the process variation upon manufacturing. The value of the threshold voltage generally changes in the range of 0.6 plus/minus 0.2 V, i.e., in the range of approximately 0.4 to 0.8 V.

The conducting or non-conducting of the transistor Tr1 is determined as follows depending upon the change of the threshold voltage. When the voltage of 0.6 V is applied as the decision potential Vcri, the threshold voltage of the transistor Tr1 of 0.6 V or more shows that the transistor Tr1 is non-conducted. On the other hand, the transistor Tr1 is conducted if the threshold voltage of the transistor Tr1 is less than 0.6 V.

The value of the combined resistance comprising the resistances R1, R2 and R3 also changes corresponding to the conducting or non-conducting of the transistor Tr1. This changes the reference potential Vref in accordance with the following two equations, so that the internal power voltage Vint can be lowered in case where the threshold voltage of the transistor is low.

Specifically, in the case of the decision potential Vcri being 0.6 V, the transistor Tr1 is non-conducted if the threshold voltage of the transistor Tr1 is 0.6 V or more, as described above. At this time, the reference potential Vref can be represented by the following equation.
In case where the transistor Tr1 is non-conducted:

$$Vref = Vcc \times R3/(R1+R3)$$

When, as one example, Vcc=5 V, R1=10 ohms, R2=100 ohms and R3=5000 ohms, the reference potential Vref is 4.99 V.

According to this equation, the reference potential Vref can be set to about 2.3 to 4.9 V by setting the resistance R1 to 10–100 ohms, the resistance R2 to 10 ohms–1 kohms and the resistance R3 to 1–10 kohms, if the external power voltage Vcc is in the range of 2.5 to 5 V.

On the other hand, the transistor Tr1 is conducted if the threshold voltage thereof is less than 0.6 V. At this time, the reference potential Vref can be represented by the following equation. In case where the transistor Tr1 is conducted:

$$Vref = Vcc \times R2 \times R3/(R1 \times R2 + R2 \times R3 + R1 \times R3)$$

When Vcc=5 V, R1=10 ohms, R2=100 ohms and R3=5000 ohms like the aforementioned example, the reference potential Vref drops to 4.54 V.

According to this equation, the reference potential Vref can be set to about 0.45 to 4.9 V by setting the resistance R1 to 10–100 ohms, the resistance R2 to 10–500 ohms and the resistance R3 to 1–10 kohms, if the external power voltage Vcc is in the range of 2.5 to 5 V.

As described above, the reference potential Vref changes in accordance with the change in the threshold voltage of the transistor Tr1 due to the process variation, whereby the internal power voltage Vint can be changed. Specifically, if the threshold voltage of the transistor Tr1 falls low due to the process variation, the reference potential Vref decreases, so that the internal power voltage Vint can be lowered.

Embodiment 2

Figure 3:
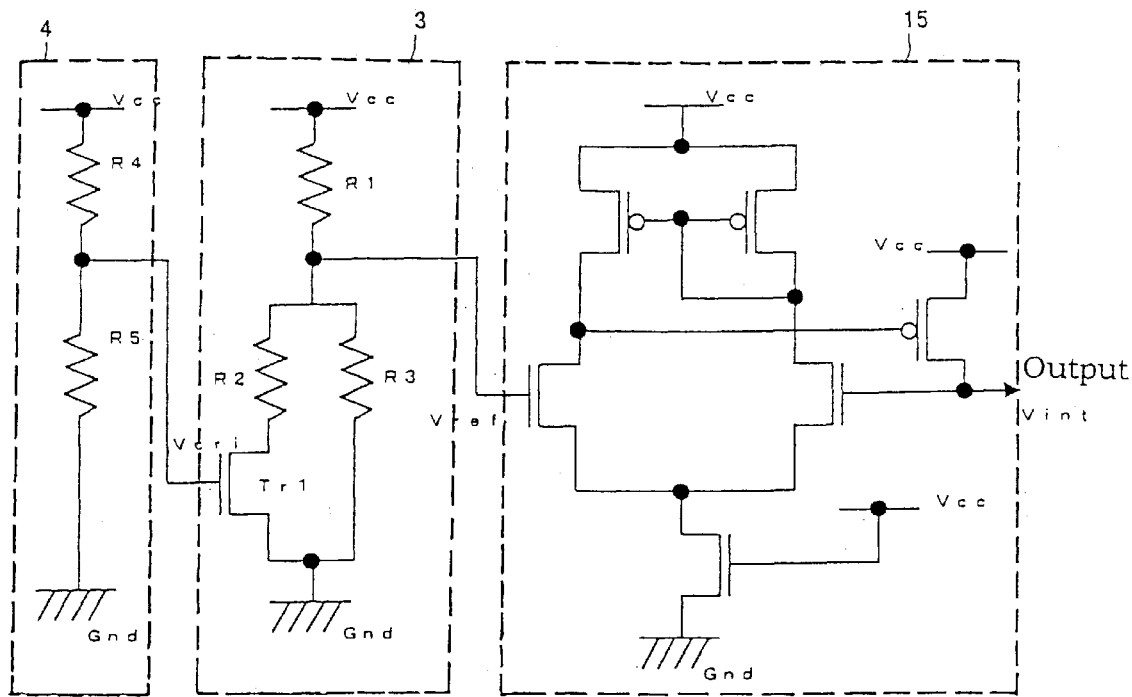
FIG. 3 is a circuit diagram showing a construction of an internal power voltage generating circuit according to an embodiment 2 of the present invention.
Figure 4:
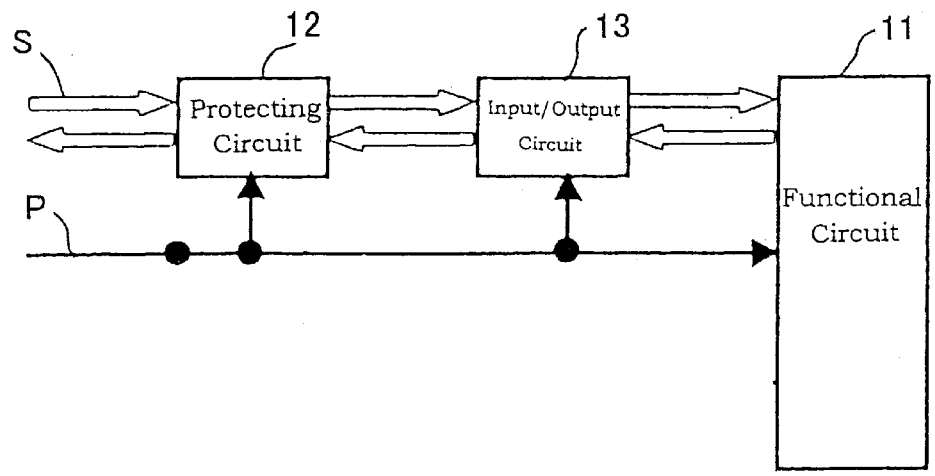
FIG. 4 is a functional block diagram of a conventional general semiconductor device.
Figure 5:
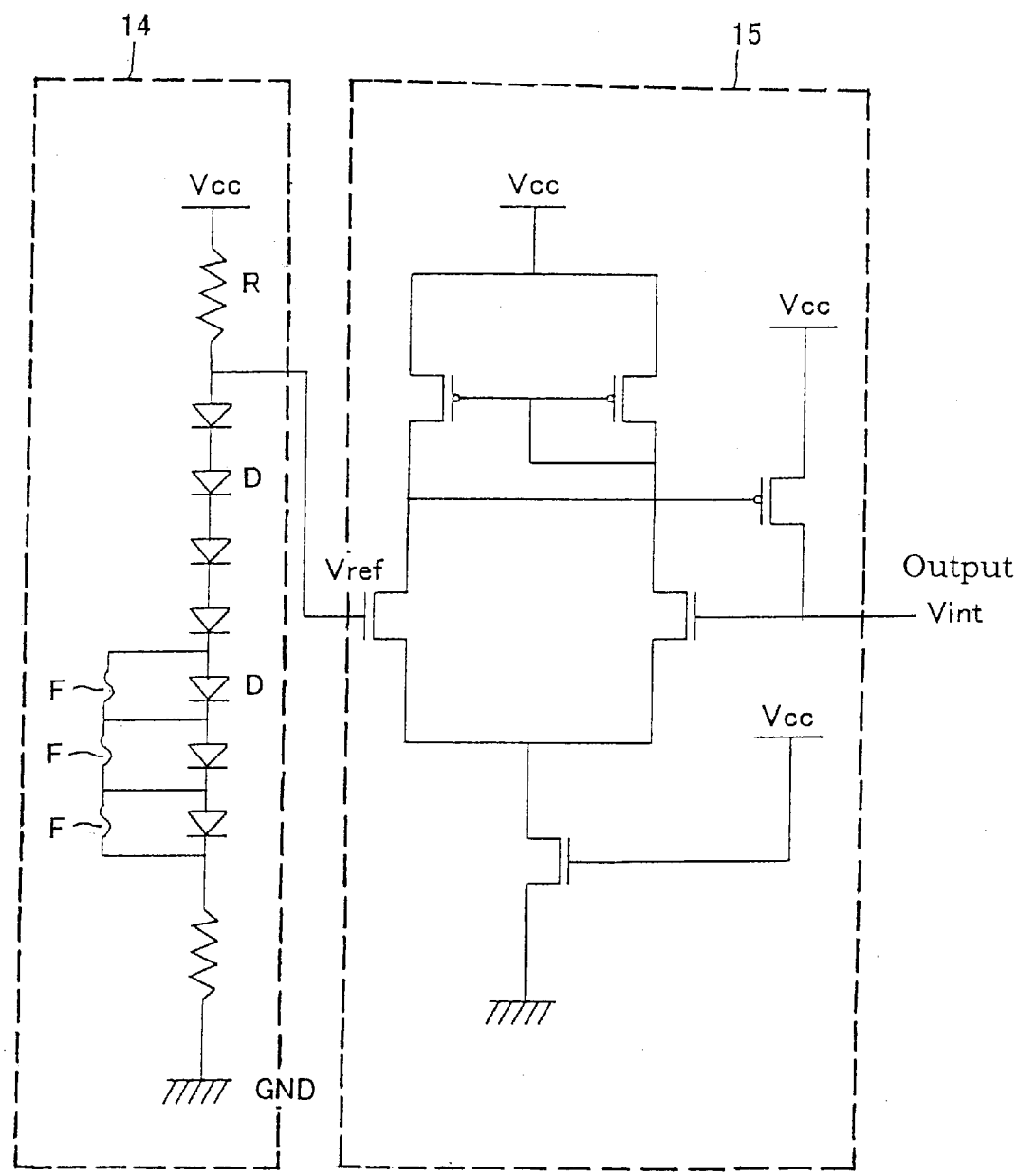
FIG. 5 is a diagram of a circuit generating an internal power voltage in a conventional semiconductor device.

FIG. 3 is a circuit diagram showing a structure of an internal power voltage generating circuit according to the embodiment 2 of the present invention.

The internal power voltage generating circuit of this embodiment differs from that of the embodiment 1 only in the reference potential generating circuit 4. The automatic voltage adjusting circuit 3 and the constant voltage circuit 15 have the same structure as those of the embodiment 1.

The reference potential generating circuit 4 has resistances R4 and R5. It divides the external power voltage Vcc via the resistances R4 and R5 to thereby generate the decision potential Vcri.

The value of the decision potential Vcri for determining the conducting or non-conducting of the transistor Tr1 in the automatic voltage adjusting circuit 3 is determined by the resistance R4 and the diode D1 in the embodiment 1.

When the silicon diode is used for the diode D1, the forward current begins to flow at the bias of approximately 0.6 V. It is convenient to set the decision potential Vcri to approximately 0.6 V because of its relatively increased accuracy. However, only the value of approximately 0.6 V can be taken.

Therefore, the present embodiment utilizes the resistance instead of the diode D1. The use of the resistance can easily change the value of the reference potential Vref with the change in the resistance value.

In this internal power voltage generating circuit, the decision potential Vcri generated in the reference potential generating circuit 4 can be represented by the following equation.

$$Vcri = Vcc \times R5/(R4+R5)$$

If the value of the resistance R4 and the value of the resistance R5 are optionally set, the value of the decision potential Vcri can optionally be changed.

According to this reference potential generating circuit 4, the decision potential Vcri can be set to about 0.02 to 4.5 V by setting the resistance R4 to 20–3000 ohms and the resistance R5 to 20–200 ohms, if the external power voltage Vcc is in the range of 2.5 to 5 V.

Even if the external power voltage is outside the range of 2.5 to 5 V, the decision potential Vcri can suitably be set by changing the values of the resistances R4 and R5.

According to the present invention, an optimum internal power voltage can be supplied without adding a process of disconnecting a fuse, whereby a maximum performance of a semiconductor chip can be got as well as the reduction in yield can be prevented.

What is claimed is:

1. An internal power voltage generating circuit of a semiconductor device, the internal power voltage generating circuit comprising:

a voltage dividing circuit comprising a field effect transistor and a plurality of resistances incorporated into a semiconductor chip, wherein the voltage dividing circuit divides an externally supplied power voltage into two different voltages depending upon whether the field effect transistor is in a conducting or a non-conducting state so that the dividing circuit outputs either of the different voltages to a plurality of transistors in the semiconductor chip given a constant externally supplied power voltage depending upon a threshold voltage of the field effect transistor, wherein the dividing circuit can output each of the different voltages given the constant externally supplied voltage, wherein the voltage dividing circuit is an automatic voltage adjusting circuit comprising a first circuit including a first resistance, and a second circuit in which a series circuit of a second resistance and the field effect transistor is connected in parallel to a third resistance, the first circuit being connected to the second circuit in series, a reference potential generating circuit for supplying a voltage that is applied to a gate electrode of the field effect transistor in the automatic voltage adjusting circuit; and wherein the reference potential generating circuit comprises a circuit in which a fourth resistance is connected in series to a diode, this circuit being utilized for dividing the externally supplied power voltage and outputting this divided voltage as a voltage that is applied to the gate electrode of the field effect transistor.

2. The internal power voltage generating circuit of claim 1, wherein the dividing of the externally supplied power voltage into two voltages by voltage dividing circuit is to change a value of the internal power voltage in accordance with a value of threshold voltage of the field effect transistor, the value of threshold voltage having been varied due to a process variation during manufacture of the semiconductor chip.

3. The internal power voltage generating circuit of claim 1, further comprising a constant voltage circuit for generating the internal power voltage when receiving the output from the automatic voltage adjusting circuit.

* * * * *